United States Patent [19]

Foo et al.

[11] Patent Number: 5,168,227
[45] Date of Patent: Dec. 1, 1992

[54] HIGH RESOLUTION IMAGING USING SHORT TE AND TR PULSE SEQUENCES WITH ASYMMETRIC NMR ECHO ACQUISITION

[75] Inventors: Thomas K. Foo, Pewaukee; Beth E. Slayman, Wauwatosa, both of Wis.

[73] Assignee: General Electric, Milwaukee, Wis.

[21] Appl. No.: 693,895

[22] Filed: May 1, 1991

[51] Int. Cl.$^5$ ............................................. G01R 33/20
[52] U.S. Cl. ................................. 324/309; 324/307
[58] Field of Search ............... 324/300, 307, 309, 312, 324/310

[56] References Cited

U.S. PATENT DOCUMENTS

| | | | |
|---|---|---|---|
| 4,713,616 | 12/1987 | Shimazaki | 324/312 |
| 4,837,513 | 6/1989 | Yao | 324/312 |
| 4,851,779 | 7/1989 | DeMeester et al. | 324/309 |
| 4,950,991 | 8/1990 | Zur | 324/312 |

OTHER PUBLICATIONS

Noll, Nishimura & Macovski, "Homodyne Detection in Magnetic Resonance Imaging", (May 1990).

*Primary Examiner*—Michael J. Tokar
*Assistant Examiner*—Raymond Y. Mah
*Attorney, Agent, or Firm*—Quarles & Brady

[57] ABSTRACT

An NMR system acquires a series of spin-echo signals during a scan and these are used to reconstruct an image. The spin-echo signals are partially acquired by locating the data acquisition window asymmetrically with respect to the echo peak. A homodyne reconstruction is employed to fill in the missing data during the image reconstruction.

3 Claims, 5 Drawing Sheets

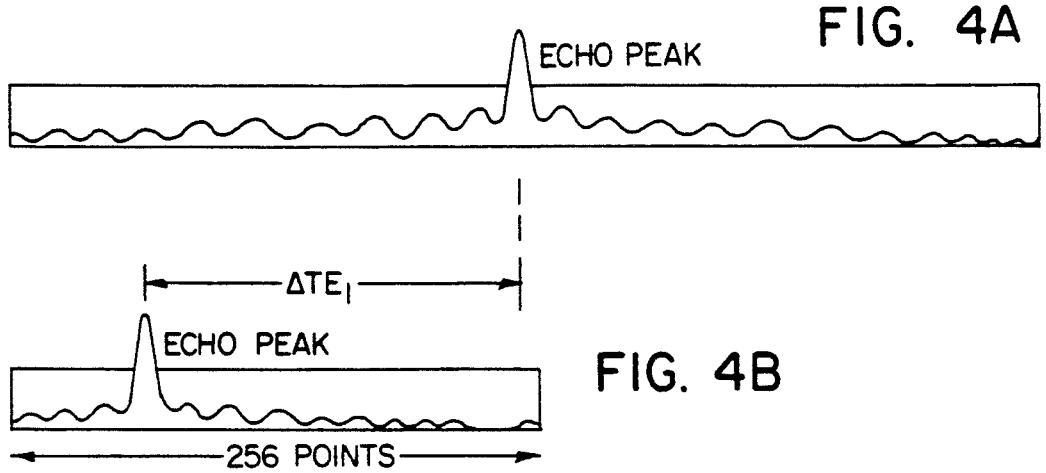
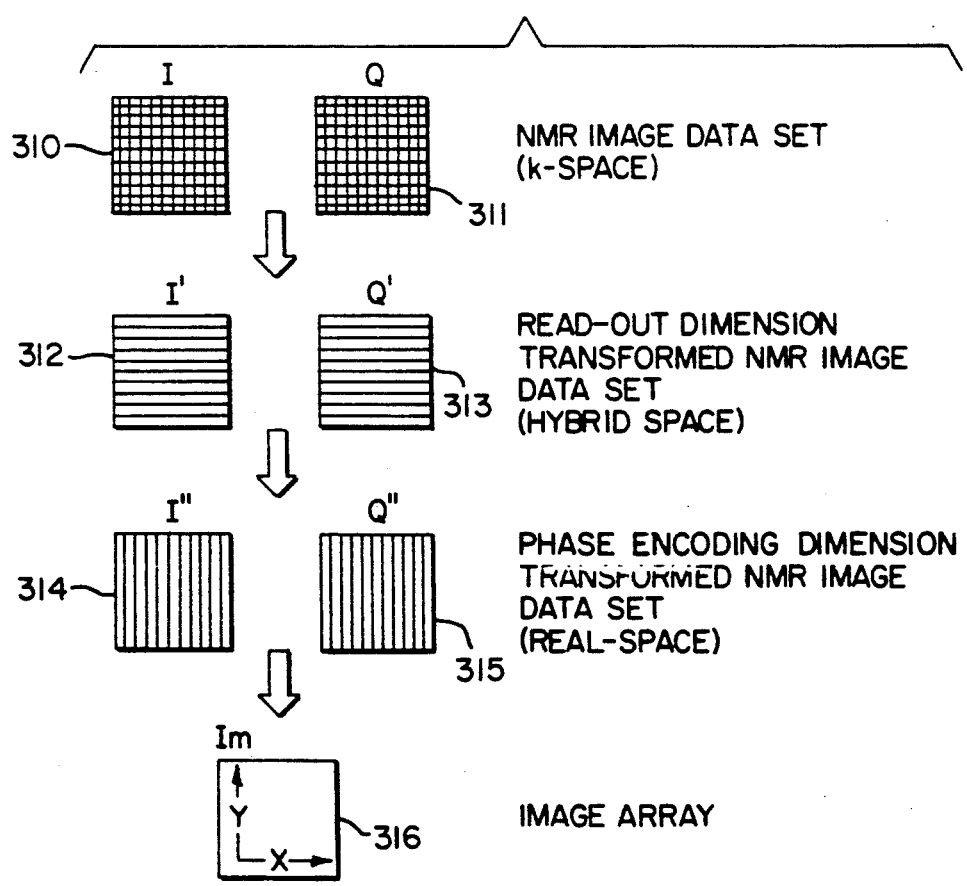

HIGH RESOLUTION IMAGING USING SHORT TE AND TR PULSE SEQUENCES WITH ASYMMETRIC NMR ECHO ACQUISITION

BACKGROUND OF THE INVENTION

The field of the invention is nuclear magnetic resonance imaging methods and systems. More particularly, the invention relates to a method for producing high resolution NMR images with short scan times.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment M is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_{xy}$, which is processing in the x-y plane at the Larmor frequency. The degree to which the net magnetic moment $M_z$ is tipped, and hence the magnitude of the net transverse magnetic moment $M_{xy}$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_{xy}$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins dephase after removal of the excitation signal $B_1$ in a perfectly homogeneous field. As will be explained below, this characteristic is used in medical imaging to contrast tissues containing spins that exhibit different spin-spin relaxation times.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest. The $T_1$ time constant is important in medical imaging because it determines the rate at which NMR measurements can be repeated without significantly degrading the NMR signal.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_{xy}$ over a range of resonant frequencies. When utilizing NMR to produce images, a technique is employed to obtain NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. The resulting set of received NMR signals are digitized and processed to reconstruct the image using one of many well known reconstruction techniques.

An image is reconstructed from the acquired NMR signals by performing a Fourier transform (FT). The preferred embodiment of the present invention employes a variant of the well known FT image reconstruction technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751-756 (1980).

The spin-warp technique employs a pulse sequence in which a slice of spins are excited by applying a "selective" r.f. excitation pulse in the presence of a slice select magnetic field gradient ($G_z$). In a two-dimensional implementation (2DFT), for example, spatial information is encoded in one direction by then applying a phase encoding gradient ($G_y$) along that direction, and then a spin-echo NMR signal is acquired in the presence of a readout magnetic field gradient ($G_x$) in a direction orthogonal to the phase encoding direction. The readout gradient present during the NMR signal acquisition encodes spatial information in the orthogonal direction. In a typical 2DFT pulse sequence, the magnitude of the phase encoding gradient pulse $G_y$ is incremented ($\Delta G_y$) in a sequence of views that are acquired during the scan to produce a set of NMR data from which an entire image can be reconstructed.

In a conventional spin-warp NMR data acquisition the spin-echo NMR signal is centered in the data acquisition window as illustrated in FIG. 4A. Typically, this centered echo signal is sampled either 128 times or 256 times within the acquisition window. The digitized samples are stored as complex numbers in a two-dimensional array in which each row in the array is one of the digitized spin-echo NMR signals. An image is reconstructed by performing a 2D Fourier transformation of the data in this array after all of the values therein have been acquired during the scan.

There are a number of factors in this NMR method which influence the quality of the reconstructed image: signal-to-noise ratio (SNR); resolution; and field of view (FOV). These factors are greatly influenced by the manner in which the NMR signal is acquired and trade-offs are required in any particular acquisition. For example, the SNR of the acquired NMR signal can be improved if the rate at which the NMR signal is sampled and digitized (i.e. receiver bandwidth) is reduced, but this results in either a decrease in image resolution because fewer samples are taken, or an increase in total scan time because the sampling must extend over a longer time period. Similarly, the minimum FOV of the image is a function of the receiver bandwidth and the readout gradient strength, and as a result, when the receiver bandwidth is reduced to improve SNR, it results in an enlargement of the FOV of the image unless the readout gradient strength is reduced by a proportional amount.

When an image is reconstructed using a conventional 2D Fourier transformation, it is imperative that the array of acquired NMR data be complete. Lack of data, or corrupted data will produce artifacts in the reconstructed image. As disclosed by D. C. Noll, D. G. Nishimura and A. Macovski in "Homodyne Detection in Magnetic Resonance Imaging", IEEE Trans. on Med. Image., May 9, 1990, however, methods are available for calculating, or filling in, some missing data. This homodyne reconstruction technique is used, for example, to reduce the number of views acquired during a scan in order to reduce total scan time. The homodyne reconstruction technique "fills in" the missing views so that a quality image can be reconstructed. The technique has also been used to shorten the pulse sequence echo time (TE) by moving the echo peak forward by an amount $\Delta TE$ in the data acquisition window as illustrated in FIG. 4B.

SUMMARY OF THE INVENTION

The present invention relates to a method and apparatus for improving the SNR and reducing the minimum FOV of a reconstructed NMR image without suffering the usual consequences of reduced resolution or increased scan time. More particularly, the present invention produces an NMR image from an incomplete NMR data set comprised of a plurality of asymmetrically acquired and digitized NMR spin-echo signals, a first transformation is performed on the incomplete NMR data set to produce a complete NMR data set, and a second transformation is performed on the complete NMR data set to produce an image data set. A homodyne reconstruction along the readout dimension is used for the first transformation to fill in the missing data from the asymmetrically acquired NMR spin-echo signal, and the second transformation is a Fourier transformation along the phase encoding dimension.

A general object of the invention is to improve the SNR of the reconstructed image without increasing scan time or reducing image resolution. The bandwidth of the receiver used to acquire the NMR spin-echo signals may be decreased to improve SNR, and a fewer number of samples of the NMR spin-echo signal may be acquired so as not to increase the total sample period. The resolution is substantially restored by using the homodyne reconstruction to effectively offset the effect of acquiring fewer sample points.

Another general object of the invention is to improve the minimum FOV of the reconstructed image in the readout gradient direction. The minimum FOV possible on any NMR system is usually limited by the maximum strength of the readout gradient which is applied during the acquisition of the NMR spin-echo signal. If the receiver bandwidth is reduced, however, the readout gradient strength required to maintain the same FOV is also reduced. Therefore, if the receiver bandwidth is reduced and the readout gradient strength is maintained, by practicing the present invention the FOV can be decreased in the readout gradient direction by an amount proportional to the bandwidth reduction.

Yet another object of the invention is to speed up the acquisition of NMR data from which high resolution images can be reconstructed. When applied to conventional spin-echo pulse sequences, higher resolution and higher SNR images can be produced in the same total scan time normally expected with spin-echo imaging. The scan time can be further reduced if gradient echo imaging is employed with the present invention.

Another object of the invention is to reduce the effects of $T^*_2$ decay on image quality. By reducing the number of samples using the present invention, the data acquisition window is shortened and the echo signal is not subject to significant $T^*_2$ decay during its acquisition. This greatly improves the quality of images from high resolution studies of structures having short $T_2$ values and regions of high magnetic susceptibility such as the human wrist, fingers, ankles and eyes.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 4A and 4B are graphic illustrations of the data acquisition window in prior art NMR pulse sequences;

FIG. 4C is a pictorial representation of a conventional 2DFT image reconstruction from the NMR data acquired in the window of FIG. 4A;

DESCRIPTION OF THE PREFERRED EMBODIMENT

Figure 1:
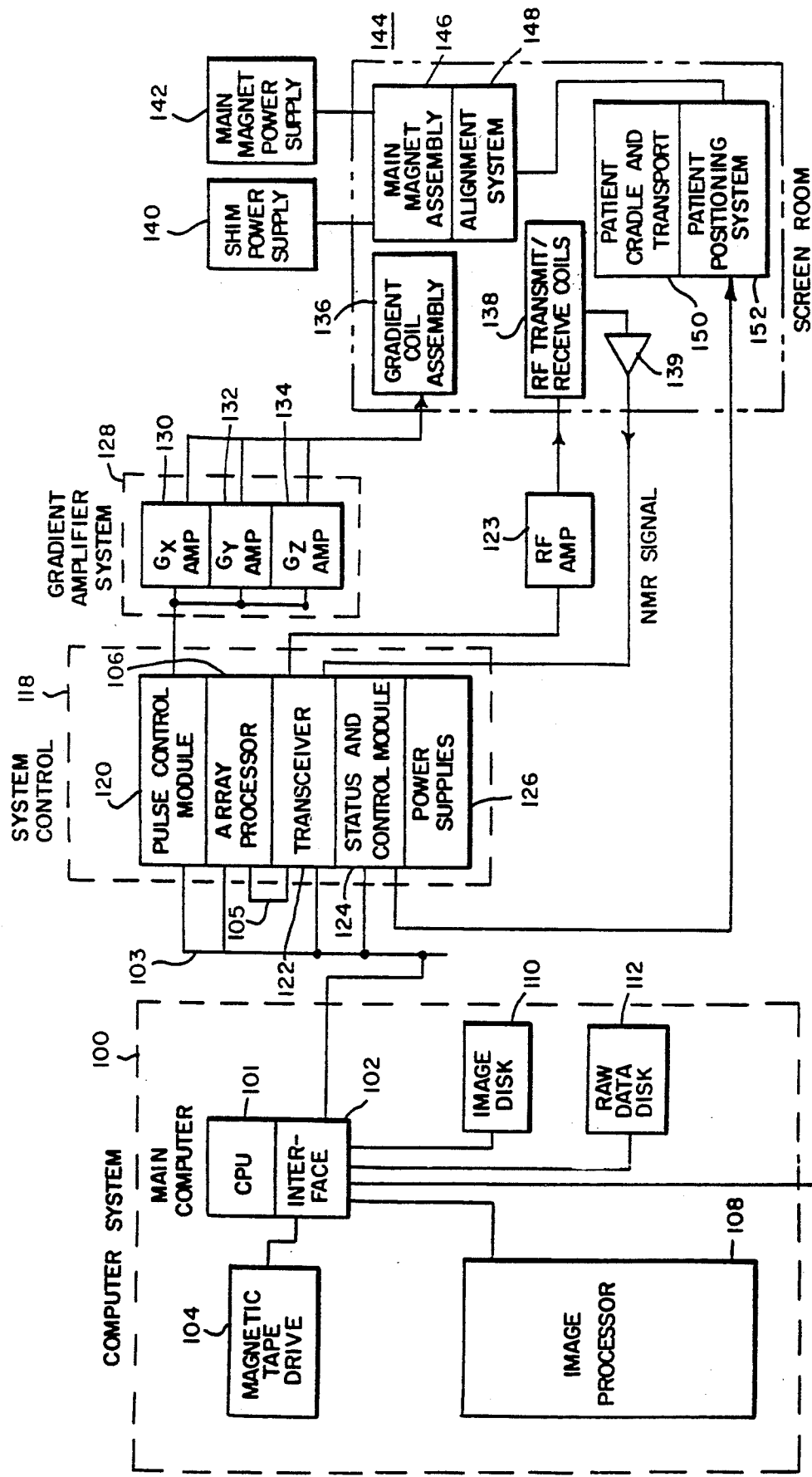
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spin in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 412 is utilized to bring the polarizing field produced by the magnet to the proper operating strength of 1.5 Tesla and is then disconnected.

To minimize interference from external sources, the NMR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
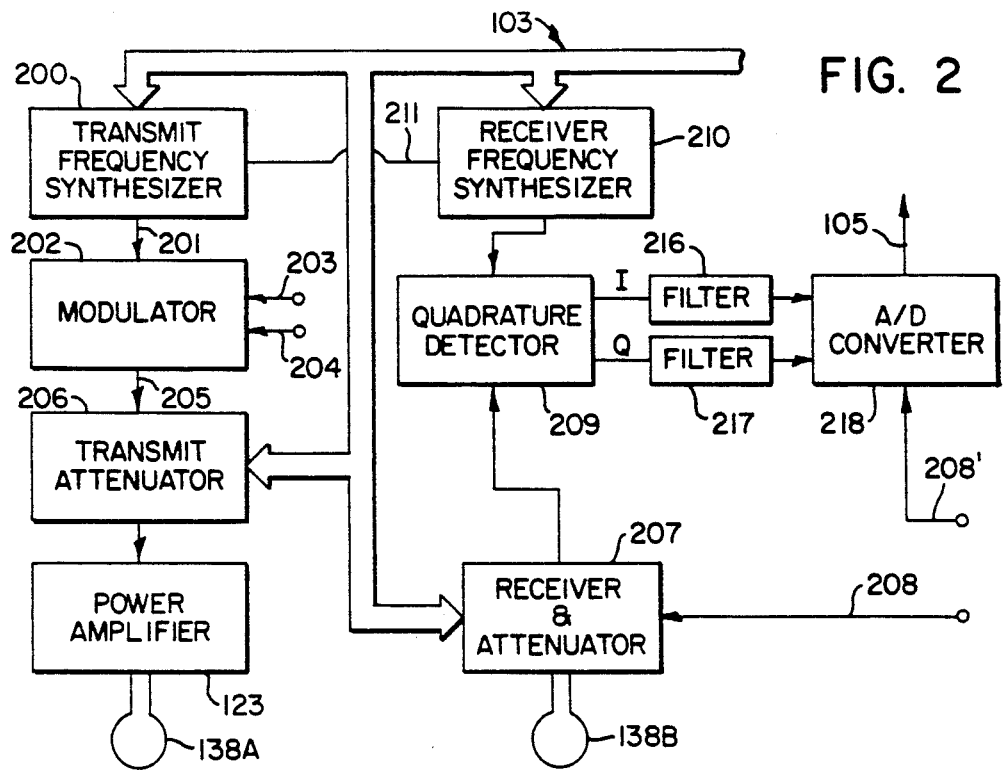
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spin in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 218 at a sample rate determined by a signal on control line 208'. A set of 128 or 256 complex digital numbers (i.e. I and Q values) are typically acquired for each NMR signal, and these digital numbers are conveyed to the main computer 101 through the serial link 105.

The A/D converter 218 is operated by the control line 208' which conveys a series of pulses from the pulse control module 120. The timing of this pulse stream determines when the NMR signal is acquired and digitized, its pulse rate determines the sample rate, and the number of pulses determines the number of samples acquired during the data acquisition window. As will now be explained, the control of the data acquisition window relative to the production of the NMR spin-echo signal being acquired is an important aspect of this invention.

Figure 3:
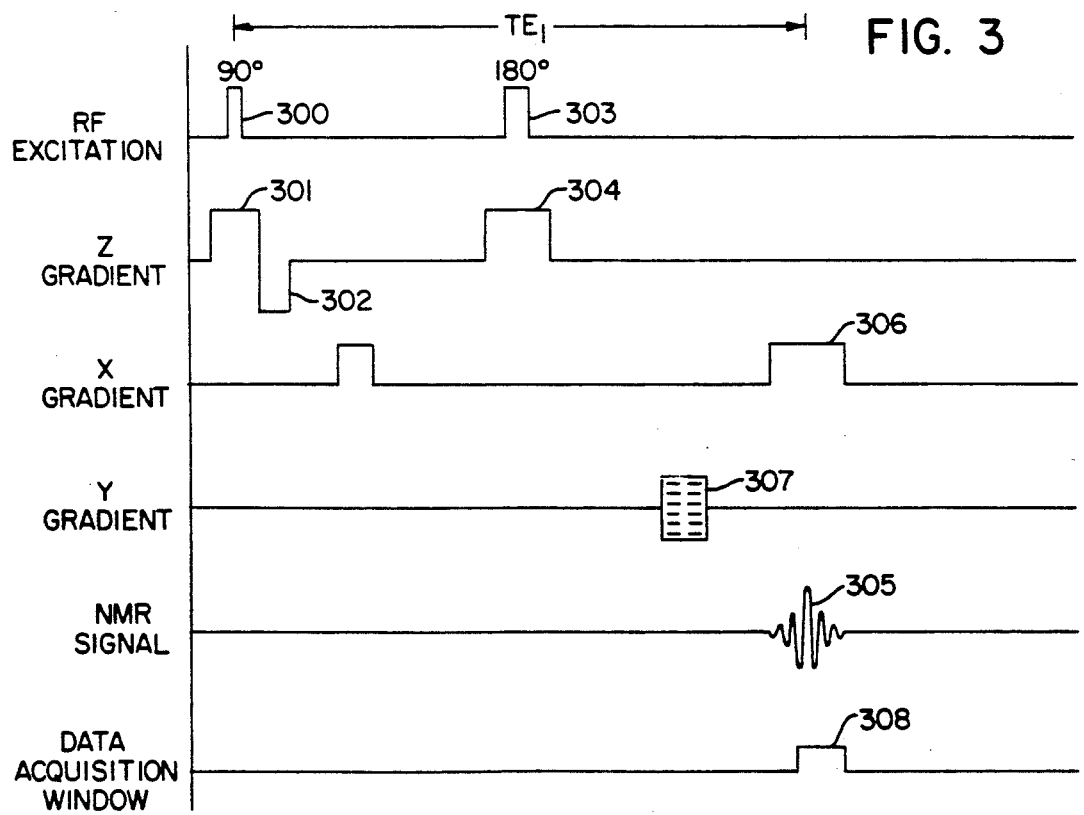
FIG. 3 is a graphic representation of a preferred embodiment of an NMR pulse sequence used to acquire data in accordance with the present invention.

The NMR system of FIG. 1 performs a series of pulse sequences to collect sufficient NMR data to reconstruct an image. One such pulse sequence is shown in FIG. 3. This sequence performs a slice selection by applying a 90° selective RF excitation pulse 300 in the presence of a z axis gradient pulse 301 and its associated rephasing pulse 302. After an interval $TE_1/2$, a 180° selective RF excitation pulse 303 is applied in the presence of another z axis gradient pulse 304 to refocus the transverse magnetization at the time $TE_1$ and produce an NMR spin-echo signal 305. The NMR spin-echo signal 305 is sampled and digitized as described above during a data acquisition window 308.

To position encode the NMR signal 305, an x axis readout gradient pulse 306 is applied during the acquisition of the NMR signal 305. The readout gradient pulse 306 frequency encodes the NMR signal 305 in the well known manner. In addition, the NMR signal 305 is position encoded along the y axis by a phase encoding gradient pulse 307. The phase encoding gradient pulse 307 has one strength during each pulse sequence, and it is typically incremented in steps through 256 discrete strengths (−128 to +128) during the entire scan. As a result, each of the 256 NMR echo signals 305 acquired during the scan is uniquely phase encoded.

It is, of course, usual practice to repeat the pulse sequence for each phase encoding gradient value one or more times and to combine the acquired NMR signals in some manner to improve signal-to-noise and to offset irregularities in the magnetic fields. In the following discussion, it is assumed that such techniques may be used to acquire the NMR data set.

In the typical prior NMR system the data acquisition window 308 is aligned with the NMR echo signal 305 such that it is sampled symmetrically on each side of the echo peak. This is shown in FIG. 4A. When such a symmetrical spin-echo signal is acquired, the NMR data is stored in the data disk 112 (FIG. 1) in the form of two arrays 310 and 311 as shown in FIG. 4C. The array 310 contains the in-phase magnitude values I and the array 311 contains the quadrature values Q. Together these arrays 310 and 311 form an NMR image data set which defines the acquired image in what is referred to in the art as "k-space". Both arrays are completely filled with acquired data, for example, 256 rows of data with 256 samples in each row.

To convert this k-space NMR data set into data which defines the image in real space (i.e. Cartesian coordinates), a two step Fourier transformation is performed on the I and Q arrays 310 and 311. The transformation is performed first in the readout direction which is the horizontal rows of the arrays 310 and 311 to produce two arrays 312 and 313. The array 312 contains the in-phase data and is labeled I', while the array 313 contains the quadrature data and is labeled Q'. The I' and Q' arrays 312 and 313 define the acquired image in what is referred to in the art as "hybrid-space".

The second Fourier transformation is performed in the phase encoding direction, which is the vertical columns of the arrays 312 and 313 to produce two arrays 314 and 315. The array 314 contains the transformed in-phase values and is labeled I", while the array 315 contains the quadrature values and is labeled Q". The arrays 314 and 315 are a data set which defines the acquired image in real space and the elements thereof are used to calculate the intensity values in a image array 316 in accordance with the following expression:

$$Im_{xy} = \sqrt{(I''_{xy})^2 + (Q''_{xy})^2}$$

The elements of the image array 316 are mapped to the main operator console 116 (FIG. 1) for display on a CRT screen.

Figure 5:
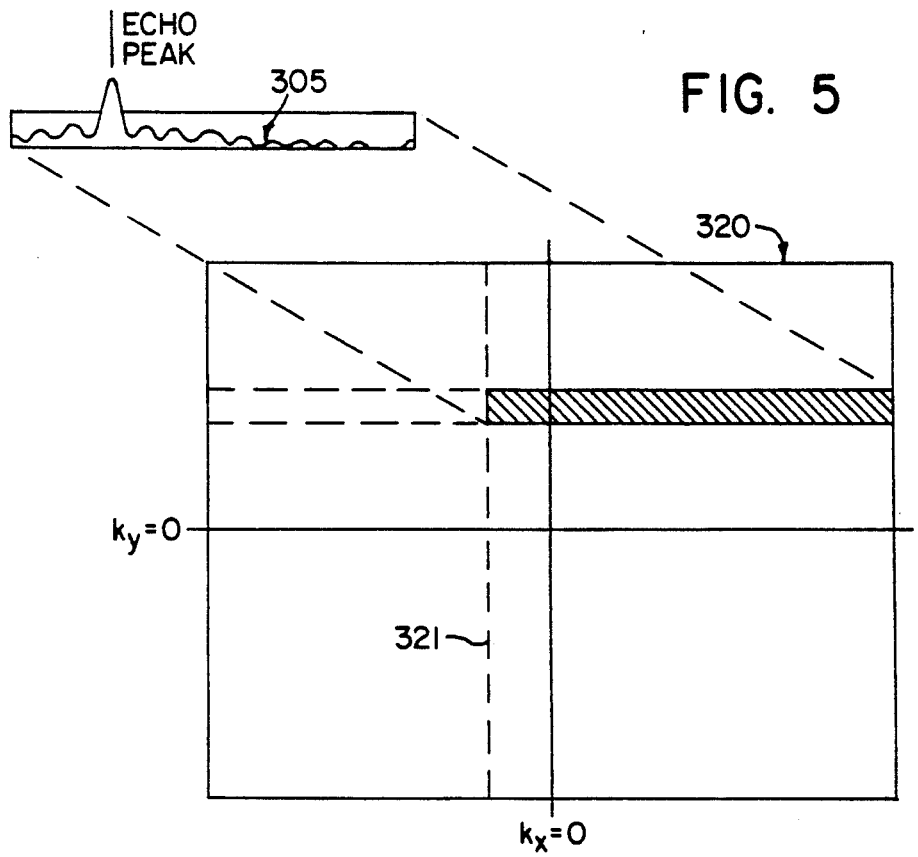
FIG. 5 is a pictorial representation of the image reconstruction using the NMR data acquired in the pulse sequence of FIG. 3 in accordance with the teachings of the present invention.

To practice the present invention the NMR echo signal 305 is acquired asymmetrically. This is illustrated in FIG. 5, where 160 samples of the NMR spin-echo signal 305 are acquired. The acquisition is asymmetric in that 26 samples are acquired prior to the echo peak and 134 samples are acquired after the echo peak. As illustrated in FIG. 3, this is accomplished by shifting the data acquisition window 308 to the right with respect to the echo time TE. The effective resolution of the reconstructed image depends on the number of samples acquired after the echo peak, and it has been found that an image equivalent in resolution to a 256 sample acquisition can be achieved with 160 samples when the present invention is employed. In situations where resolution can be sacrificed, the number of samples can, of course, be reduced further to shorten the data acquisition window. In addition, an image equivalent to a resolution of 512 samples can be achieved with 286 acquired data samples when the present invention is employed. This means that an image with twice the pixel resolution can be obtained by only increasing the number of data samples by 10% over a 256 data sample symmetric echo acquisition.

Referring particularly to FIG. 5, each asymmetrically acquired NMR echo signal 305 is stored on a row of an NMR data set 320. As explained above, separate I and Q values are actually stored, but for clarity of explanation, only a single data array 320 is shown in FIG. 5. A complete scan is comprised of 256 views and thus the vertical, or phase encoding dimension of the NMR data set 320 extends from $k_y = -128$ to $k_y = 128$. The horizontal dimension of the NMR data set 320, however, is much larger than the 160 acquired samples. The sample NMR echo signals 305 fill only 60% of each row and the remaining 40% is filled with zeros. The NMR data set 320 extends from $k_x = -128$ to $k_x = 128$ in the horizontal, or readout gradient dimension. The sampled NMR spin-echo signals 305 extend from $k_x = -26$ to $k_x = 128$ to fill the NMR data set 320 to the right of the dashed line 321. The elements to the left of the dashed line 321 are filled with zeros.

Figure 6:
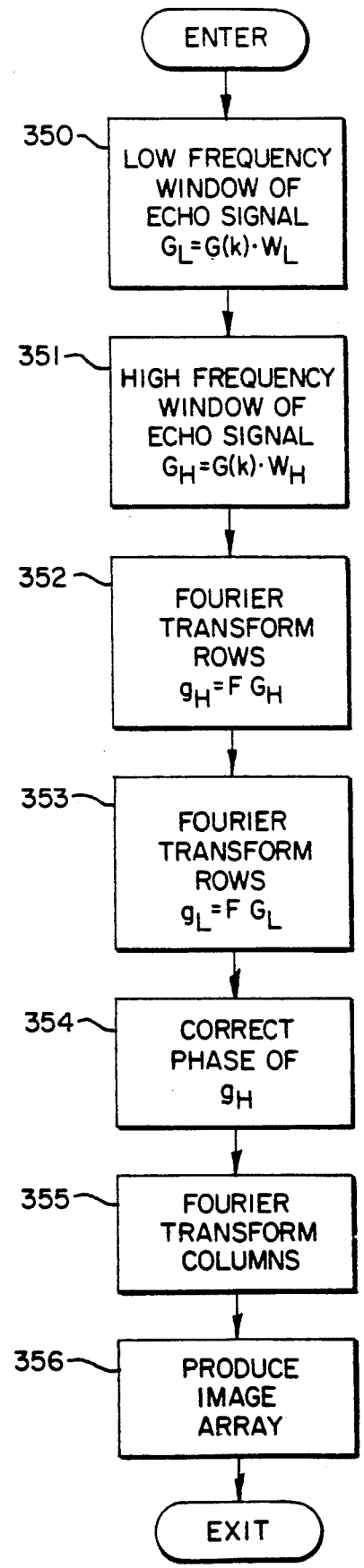
FIG. 6 is a flow chart of the program executed by the system of FIG. 1 to implement the present invention.

The NMR data set 320 is employed to produce an image using a homodyne reconstruction technique. This is accomplished under the direction of a program which is executed by the computer 101 (FIG. 1) and which is illustrated in FIG. 6.

The first step in the reconstruction process is to produce two separate data sets ($G_L$) and ($G_H$) from the NMR data set 320 ($G_K$). This is accomplished by multiplying each row of the NMR data set 320 by the following low frequency window function $W_L$:

$$W_L = (1 + e^{(k-k_1)/T})^{-1} - (1 + e^{(k+k_1)T/})^{-1} \quad (1)$$

where:
$T = 4$ in the preferred embodiment;
$k_1 = 18$ in the preferred embodiment; and
$k =$ the position of the value being windowed along the readout dimension ($k_x$), where $k = -128$ to 128.

The 256 values ($G_K$) in each row of the NMR data set 320 (including the zero-filled points) are multiplied by the value of the window function $W_L$ as indicated at process block 350 to produce a separate array $G_L$.

$$G_L = W_L \cdot G_K \quad (2)$$

Similarly, as indicated at process block 351, each value $G_K$ in the NMR data set 320 is also multiplied by a high frequency window $W_H$ as follows:

$$G_H = W_H \cdot G_K \quad (3)$$

where $$W_H = 2 - (1 + e^{(k-k_1)/T})^{-1} - (1 + e^{(k+k_1)T/})^{-1}, \quad (4)$$

$T = 4$
$k_1 = 18$
$k =$ the position of the value being windowed along the readout dimension ($k_x$), where $k = -128$ to 128.

Each of the 256 by 256 element data arrays $G_L$ and $G_H$ are then separately Fourier transformed as indicated by process blocks 352 and 353. These are complex Fourier transformations along the horizontal, row direction as would normally be performed in a 2DFT reconstruction. Two, separate 256 by 256 element arrays $g_H$ and $g_L$ result. Due to the hermetian symmetry property of the Fourier transformation process, the zero filled portion of the NMR data set 320 is filled in by the transformation process and the transformed data in the array $g_H$ is complete and sufficient to produce an image. However, spatially dependent phase shifts present in the image must be corrected. The data in the transformed data array $g_L$ contains the low frequency phase information necessary to make this correction. This is based on the assumption that the spatially dependent phase shifts have primarily a low frequency variation and can be approximated by the phase of the data array $g_L$. The next step in the process, therefore, is to correct the phase of the array elements $g_H$ as indicated at process block 354. This can be performed in a number of ways, but it is in essence a process in which the phase ($\phi_H$) of each complex element in the transformed array $g_H$ is changed by the phase ($\phi_L$) of the corresponding element in the transformed array $g_L$. This is performed as follows in the preferred embodiment:

$$f_x = g_H \cdot |g_L| / g_L \quad (5)$$

where $f_x$ is the complex value of each element in a 256 by 256 element array (f) which represents the NMR image data in hybrid-space.

As indicated in FIG. 6 at process block 355, the next step is to Fourier transform the hybrid-space array f in the column, or phase encoding direction. This is a complex Fourier transformation as is done in a conventional 2DFT reconstruction, and it produces two 256 by 256 element data arrays which correspond to the arrays 314 and 315 in FIG. 4C. The final step, therefore, is to create the image array 316 in the usual manner as indicated in FIG. 6 at process block 356 and in the above equation.

The present invention can be employed to achieve a number of benefits. In the preferred embodiment the signal-to-noise ratio (SNR) of the acquired NMR spin-echo signal 305 is improved by reducing the bandwidth of the receiver from ±16 kHz to ±8 kHz. This is achieved by reducing the sample rate and the readout gradient amplitude by 50%. In prior art systems this would result in a doubling of the duration of the data acquisition window with a consequent increase in scan time and an increase in artifacts due to the effects of $T^*_2$ decay during the longer acquisition window. By employing the asymmetric spin-echo signal acquisition technique of the present invention, however, the length of the acquisition window remains the same, but the number of samples is cut by 40% to 160 samples. This does not result in a 40% reduction in resolution because the present invention enables a 256 pixel image to be reconstructed from 160 samples. Additionally, fewer data points can be acquired with a slight reduction in resolution. For example, if we cut the number of data samples by half from 256 to 128, an image with a resolution equivalent to 204 pixels can be obtained. The difference in an image with an effective resolution of 204 versus 256 is slight. The SNR of the resulting image is improved by the reduction in receiver bandwidth, but this improvement is offset to some extent by the increase in correlated noise which results from the asymmetric echo acquisition. More specifically, reducing the receiver bandwidth by a factor of n provides a $\sqrt{n}$ improvement in SNR. In the preferred embodiment, for example, the bandwidth is reduced by a factor of 2 and this leads to an SNR improvement of 1.414. However, as a result of increased correlated noise when the present invention is employed, the noise is increased by about 30%, reducing the image SNR by about a factor of 0.770. When these factors are together, an increase in image SNR of about 9% (1.414×0.770=1.090) is achieved.

The present invention also enables the NMR system to reduce its minimum field-of-view (FOV). For example, with standard readout gradient amplifiers on the system of FIG. 1, the minimum possible FOV is 8 cm. This assumes a ±16 kHz receiver bandwidth and a maximum possible readout gradient field strength of 0.95 gauss/cm. If the receiver bandwidth is reduced to ±8 kHz as described above, the readout gradient amplitude is also reduced in order to maintain the same FOV. However, if the readout gradient is maintained at its maximum level under this condition, the FOV is reduced to 4 cm. In otherwords, a 256 pixel image of a 4 cm region of interest in the patient can be achieved without changing the gradient power amplifiers or adding more gradient power amplifiers.

In terms of image SNR, if the SNR of a standard 8 cm FOV image is unity, a 4 cm FOV image using the standard receiver bandwidth would yield an image SNR of 0.25 or one quarter of the original. By using a smaller receiver bandwidth and asymmetric echo acquisition, the result is an image with a SNR of 0.273 (0.25×1.090). Hence, a much higher resolution image can be acquired (with existing gradient hardware) with better than expected image SNR. All this can be attained without loss of image resolution or increase in data acquisition time.

Figure 7:
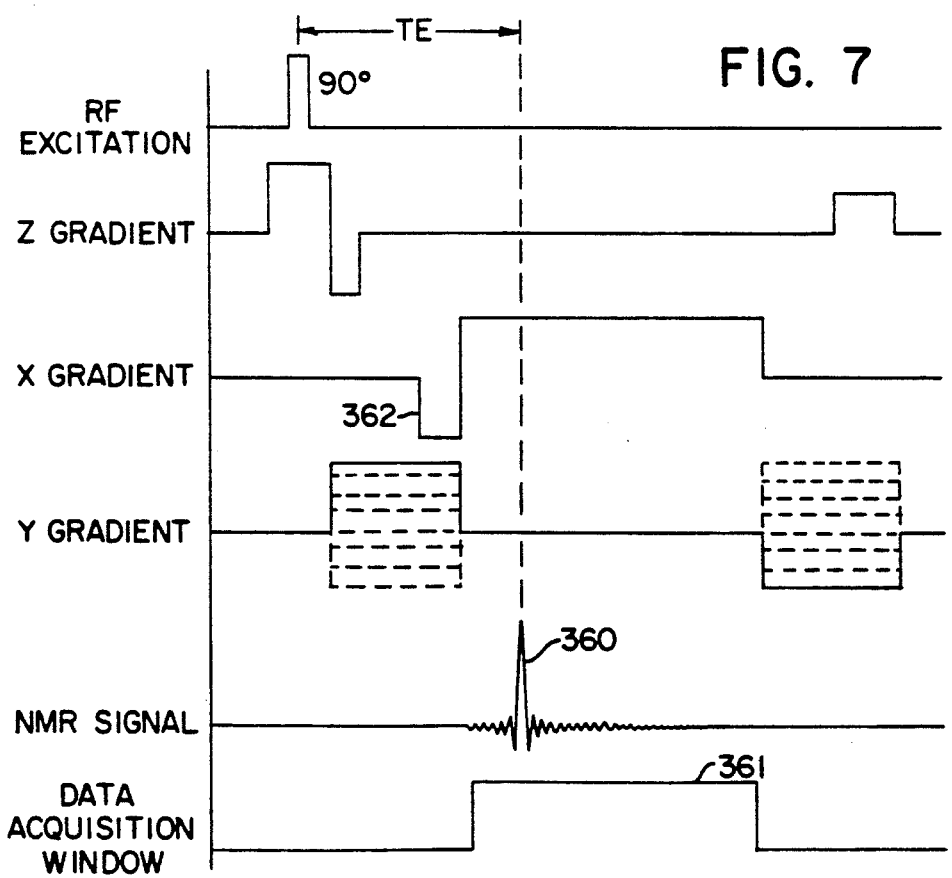
FIG. 7 is a graphic representation of an alternative embodiment of an NMR pulse sequence used to acquire data in accordance with the present invention.

Referring particularly to FIG. 7, the ability of the present invention to shorten the total scan time without a reduction in image resolution is most apparent when applied to a "fast-scan" pulse sequence. The fast-scan pulse sequence illustrated in FIG. 7 is referred to in the art as a gradient recalled acquisition in the steady state (GRASS) sequence, but it has been modified such that the peak of the NMR echo signal 360 is shifted forward and is asymmetric with respect to the data acquisition window 361. This is accomplished by shortening the negative readout gradient pulse 362, which in turn shortens the entire pulse sequence. In addition, the length of the data acquisition window 361 is shortened by approximately 40% over a conventional GRASS pulse sequence to further reduce the length of the pulse sequence and hence the total scan time. The acquired data is processed in the same manner as described above.

We claim:

1. An NMR system which comprises
means for generating a polarizing magnetic field;
excitation means for generating an RF excitation magnetic field which produces transverse magnetization in spins subjected to the polarizing magnetic field;
receiver means for sensing the NMR signal produced by the transverse magnetization;
data acquisition means connected to receive the NMR signal sensed by the receiver means and being operable in response to a control signal to acquire and digitize a series of NMR signal samples during a data acquisition window;
first gradient means for generating a first magnetic field gradient to impart a first phase component into the NMR signal which is indicative of spin location along a first coordinate axis;
second gradient means for generating a second magnetic field gradient to impart a second phase component into the NMR signal which is indicative of spin location along a second coordinate axis;
pulse control means coupled to the excitation means, first and second gradient means, and data acquisition means, said pulse control means being operable to conduct a scan comprised of a series of pulse sequences in which the second magnetic field gradient is stepped through a series of discrete values, a corresponding series of NMR echo signals are produced, the first magnetic field gradient is produced while each NMR echo signal is produced, and each NMR echo signal is acquired to form an NMR data set by generating a control signal to the data acquisition means which aligns the data acquisition window asymmetrically with respect to the peak of the NMR echo signal;
processor means for storing each acquired NMR echo signal in the NMR data set as part of a corresponding row in an NMR data array and for reconstructing an image array, the processor means including:
(a) means for filling the remaining part of each row in the NMR data array with zeros;
(b) means for performing a homodyne corrected Fourier transformation of each row of the NMR data array to produce a hybrid-space NMR data array;
(c) means for performing a Fourier transformation on each column of the hybrid-space NMR data array to produce a real space NMR data array;
(d) means for producing the image array from the real space NMR data array; and
the means for performing the homodyne corrected Fourier transformation includes:
(i) means for multiplying the data in each row of the NMR data array by a low frequency window function $W_L$ to produce a $G_L$ data array;
(ii) means for multiplying the data in each row of the NMR data array by a high frequency window function $W_H$ to produce a $G_H$ data array;
(iii) means for Fourier transforming each row of both the $G_L$ and $G_H$ data arrays; and
(iv) means for producing the hybrid-space NMR data array from the $G_H$ data array by correcting the phase of the values in the $G_H$ data array with the phase indicated by corresponding values in the $G_L$ data array.

2. The NMR system as recited in claim 1 in which the window function $W_L$ is defined as:

$$W_L = (1 + e^{(k-k_1)/T})^{-1} - (1 + e^{(k+k_1)T/})^{-1}$$

where T is a constant, $k_1$ is a constant and k is the position along the row of the NMR data array of the data being multiplied; and
in which the window function $W_L$ is defined as follows;

$$W_H = 2 - (1 + e^{(k-k_1)/T})^{-1} - (1 + e^{(k+k_1)T/})^{-1}.$$

3. In an NMR system which acquires NMR data with a scan comprised of a series of pulse sequences and reconstructs an image from the acquired NMR data, the improvement comprising:
generating an RF excitation magnetic field in the presence of a polarizing magnetic field to produce transverse magnetization in spins subjected to the polarizing magnetic field;

refocusing the transverse magnetization to produce an NMR echo signal having a peak amplitude which occurs at a time TE after the generation of the RF excitation magnetic field;

applying a readout magnetic field gradient to the spins subjected to the polarizing magnetic field to impart a first phase component into the NMR echo signal which is indicative of spin location along a readout axis;

applying a phase encoding magnetic field gradient to the spins subjected to the polarizing magnetic field to impart a second phase component into the NMR echo signal which is indicative of spin location along an axis perpendicular to said readout axis;

sampling the NMR echo signal with a receiver during a data acquisition window and storing successive samples in a row of an NMR data array, wherein the data acquisition window is aligned asymmetrically with respect to the peak amplitude of the NMR echo signal, the NMR echo signal is partially acquired to shorten the duration (TR) of each pulse sequence, and the row of said NMR data array is partially filled with samples; and processing the NMR data array by:
(a) filling the remaining part of each row in the NMR data array with zeros;
(b) performing a homodyne corrected Fourier transformation of each row of the NMR data array to produce a hybrid-space NMR data array;
(c) performing a Fourier transformation on each column of the hybrid-space NMR data array to produce a real space NMR data array; and
(d) producing the image array from the real space NMR data array.

* * * * *

UNITED STATES PATENT AND TRADEMARK OFFICE
CERTIFICATE OF CORRECTION

PATENT NO. : 5,168,227
DATED : December 1, 1992
INVENTOR(S) : Thomas K. Foo

It is certified that error appears in the above-indentified patent and that said Letters Patent is hereby corrected as shown below:

Col. 1, line 50, "$A=A_0 e^{-t/T*2}$" should be --$A=A_{0e}^{-t/T*}{}_2$--.

Col. 11, line 50, "comprises" should be --comprises:--.

Col. 12, line 56, "function $W_L$" should be --function $W_H$--.

Signed and Sealed this

Fourth Day of January, 1994

Attest:

BRUCE LEHMAN

Attesting Officer

Commissioner of Patents and Trademarks